(12) United States Patent
Laermer et al.

(10) Patent No.: US 8,671,746 B2
(45) Date of Patent: Mar. 18, 2014

(54) PIEZOELECTRIC GENERATOR

(75) Inventors: Franz Laermer, Weil der Stadt (DE); Thorsten Pannek, Stuttgart (DE); Ralf Reichenbach, Esslingen (DE); Marian Keck, Leonberg (DE)

(73) Assignee: Robert Bosch GmbH, Stuttgart (DE)

( * ) Notice: Subject to any disclaimer, the term of this patent is extended or adjusted under 35 U.S.C. 154(b) by 262 days.

(21) Appl. No.: 13/202,561

(22) PCT Filed: Jan. 11, 2010

(86) PCT No.: PCT/EP2010/050220
§ 371 (c)(1),
(2), (4) Date: Aug. 19, 2011

(87) PCT Pub. No.: WO2010/094520
PCT Pub. Date: Aug. 26, 2010

(65) Prior Publication Data
US 2011/0296906 A1  Dec. 8, 2011

(30) Foreign Application Priority Data
Feb. 20, 2009 (DE) .......................... 10 2009 001 031

(51) Int. Cl.
*G01M 17/02* (2006.01)
(52) U.S. Cl.
USPC ........................................... 73/146; 73/146.5
(58) Field of Classification Search
None
See application file for complete search history.

(56) References Cited

U.S. PATENT DOCUMENTS

| | | | | |
|---|---|---|---|---|
| 4,467,236 | A | * | 8/1984 | Kolm et al. ................ 310/321 |
| 5,118,981 | A | * | 6/1992 | Kobayashi et al. .......... 310/329 |
| 5,140,529 | A | * | 8/1992 | Peifer ......................... 700/280 |
| 5,339,698 | A | * | 8/1994 | Robinson et al. ........ 73/862.59 |
| 5,417,120 | A | * | 5/1995 | Hulsing, II ............... 73/862.59 |
| 7,145,270 | B2 | * | 12/2006 | Mizuno .................... 310/12.19 |
| 7,459,837 | B2 | * | 12/2008 | Clingman et al. ........... 310/339 |
| 7,692,366 | B2 | * | 4/2010 | Thiesen ....................... 310/339 |
| 7,919,907 | B2 | * | 4/2011 | Reichenbach et al. ....... 310/339 |
| 7,999,663 | B2 | * | 8/2011 | Mancosu et al. ............. 340/445 |
| 8,154,177 | B1 | * | 4/2012 | Churchill et al. ............ 310/339 |
| 8,222,754 | B1 | * | 7/2012 | Soliman et al. .............. 290/1 R |
| 2004/0055293 | A1 | | 3/2004 | Pistor |

FOREIGN PATENT DOCUMENTS

| | | |
|---|---|---|
| CN | 101098792 A | 1/2008 |
| CN | 101193764 A | 6/2008 |
| DE | 10 2007 006 994 | 2/2008 |
| EP | 2 113 953 | 11/2009 |
| WO | 2007/099159 A1 | 9/2007 |

OTHER PUBLICATIONS

International Search Report corresponding to PCT Application No. PCT/EP2010/050220, mailed Mar. 9, 2010 (German and English language document) (5 pages).

* cited by examiner

*Primary Examiner* — Lisa Caputo
*Assistant Examiner* — Jermaine Jenkins
(74) *Attorney, Agent, or Firm* — Maginot, Moore & Beck

(57) ABSTRACT

A piezoelectric generator includes a piezoelectric element, a spring element, a mass element, and at least one stop. The piezoelectric element, the spring element, and the mass element form a system which can oscillate. The stop limits the oscillation of the system which can oscillate, at least on one side. The stop is formed from a ductile material or has a coating of a ductile material.

13 Claims, 3 Drawing Sheets

(A-A)

(A-A)

PIEZOELECTRIC GENERATOR

This application is a 35 U.S.C. §371 National Stage Application of PCT/EP2010/050220, filed Jan. 11, 2010, which claims the benefit of priority to Application Serial No. DE 10 2009 001 031.9, filed Feb. 20, 2009 in Germany, the disclosures of which are incorporated herein by reference in their entirety.

The present disclosure relates to a piezoelectric generator, in particular for use in a vehicle tire monitoring system.

BACKGROUND

Wire-free electronic appliances are becoming ever more widely used. However, one problem in this case is the power supply. Batteries or rechargeable batteries are generally large and heavy, and have to be replaced or recharged.

Piezoelectric generators, which convert the environmental energy, for example in the form of oscillations, by mechanical-electrical conversion to electrical energy, may be considered for use for applications with a low power consumption.

DE 10 2007 006 994 A1 describes a piezoelectric generator in which a mass element and a spring device, which has a piezoelectric element, form a system which can oscillate. For protection against overloading as a result of very high accelerations, this piezoelectric generator has stops which limit the deflection of the system. However, high-frequency oscillations can occur when striking a stop, and these can adversely affect the life of the piezoelectric generator.

SUMMARY

The subject matter of the present disclosure is a piezoelectric generator which has a piezoelectric element, a spring element, a mass element and at least one stop, wherein the piezoelectric element, the spring element and the mass element form a system which can oscillate, in particular which can carry out bending oscillations, wherein the stop limits the oscillation of the system which can oscillate, at least on one side. In this case, according to the disclosure, the stop is formed from a ductile material or has a coating of a ductile material.

Energy can be extracted from the system which can oscillate, and high-frequency oscillations can be reduced or avoided, by deformation of the material. This in turn has the advantage that the reliability of the piezoelectric generator can be increased, and the life of the piezoelectric generator can be lengthened. In contrast to a stop composed of a ductile material according to the disclosure, a non-ductile stop, for example composed of a hard steel, would return the impulse directly back into the system again, without being damped, in the process exciting higher-frequency, more damaging, oscillation forms.

A metal which crystallizes cubically on an area-centered basis, or a metal alloy which crystallizes cubically on an area-centered basis can be used as ductile material. For example, the ductile material can be selected from the group consisting of aluminum, copper, iron, gold, silver, lead, nickel, platinum and alloys thereof. For environmental reasons, it may be advantageous not to use lead as the ductile material. For the purposes of one embodiment of the present disclosure, the ductile material is therefore selected from the group consisting of aluminum, copper, iron, gold, silver, nickel, platinum and alloys thereof.

For the purposes of the present disclosure, the ductile material may also be a plastic, for example a tough and hard-wearing plastic. In order to make it possible to improve the hard-wearing nature of a plastic, fibers, for example glass fibers, can be added to the plastic. By way of example, the ductile material may be a plastic which is glass fibrous, for example a polyamide filled with glass fibers. By way of example, plastic stops can be formed by means of an injection-molding process, in particular a two-component injection-molding process, for example together with a housing or another component.

For the purposes of one embodiment of the disclosure, the piezoelectric generator has two or more stops. In particular, the stops in this case limit the oscillation of the system which can oscillate, on both sides. For this purpose, the stops are preferably arranged on both deflection sides of the oscillation. For example, one to five stops can be arranged on each deflection side. In particular, the piezoelectric generator may have an even number of stops, wherein half of the stops in each case limit the oscillation of the system which can oscillate on one deflection side, and the other half of the stops limit the oscillation of the system which can oscillate, on the other deflection side. For the purposes of the present disclosure, the stops are preferably arranged such that the stops protect the system which can oscillate against overloading as a result of high accelerations and/or limit the oscillations of the system which can oscillate to a level at which the system which can oscillate is not loaded beyond its mechanical strength.

For the purposes of a further embodiment of the disclosure, the piezoelectric generator has at least one eddy-current brake. The eddy-current brake preferably brakes the oscillation of the system which can oscillate, at least on one side. This allows the eddy-current brake to extract energy from the system in the case of overloading, in addition to the energy-absorbent stops.

By way of example, a permanent magnet is suitable for use as an eddy-current brake. The eddy-current brakes are preferably arranged in the immediate vicinity of at least one stop. The oscillations of the system which can oscillate and the eddy-current brake allow a voltage and therefore eddy-currents to be induced in the system which can oscillate, with a magnetic field being produced, which opposes the magnetic field of the eddy-current brake. In the case of an oscillation with a small deflection, for example during normal operation of the generator, the magnetic field that is produced is preferably small and has no influence, or only a very minor influence, on the oscillation of the system which can oscillate. In the immediate vicinity of the eddy-current brake, the magnetic field which is produced is, however, preferably sufficiently high to brake the oscillation of the system which can oscillate. The speed of the deflected area of the system which can oscillate is preferably braked to a major extent, or to be equal to zero, before or close to the eddy-current brake or the stop. Since excitation oscillations with high amplitudes cause high speeds, and these in turn cause high eddy-currents, these are advantageously braked to a particularly great extent.

For the purposes of a further embodiment of the disclosure, the spring element and/or the mass element are/is formed from a metal or a metal alloy having high electrical conductivity. This has the advantage that eddy-currents which are induced are higher because of the high electrical conductivity, and the braking effect is therefore maximized. For the purposes of the present disclosure, a metal or a metal alloy with high electrical conductivity may be understood to mean, in particular, a metal or a metal alloy having an electrical conductivity of $\geq 15 \cdot 10^6$ S/m at 300 K, for example a metal or a metal alloy selected from the group consisting of silver, copper, gold, aluminum and alloys thereof.

For the purposes of a further embodiment of the disclosure, the piezoelectric generator has two or more eddy-current brakes. The eddy-current brakes preferably brake the oscillation of the system which can oscillate, on both sides. For this purpose, the eddy-current brakes can be arranged on both deflection sides of the oscillation. The piezoelectric generator preferably has an even number of eddy-current brakes, wherein one half of the eddy-current brakes the oscillation of the system which can oscillate on one deflection side, and the other half of the eddy-current brakes the oscillations of the system which an oscillate on the other deflection side. In this case, the eddy-current brakes which are arranged on the two deflection sides of the oscillation may, in particular, be arranged to be symmetrical with respect to one another. The eddy-current brakes are preferably arranged on the two deflection sides of the oscillation such that their magnetic fields are cancelled out on the plane of the system which can oscillate. This has the advantage that, in the case of oscillations in the small-signal range, that is to say within this "neutral zone", no or only a small braking effect is produced by eddy-currents, whereas larger oscillations, or even oscillations caused by overloading, depart from the neutral zone and are subject to a strong braking effect because of eddy-currents.

For the purposes of the present disclosure, the piezoelectric element can preferably be deformed elastically during the oscillation of the system which can oscillate. The piezoelectric element, the spring element and the mass element may be designed to be substantially flat. In this case, "designed to be flat" can be understood to mean a flat three-dimensional body. In particular, the piezoelectric element may be in the form of a strip or strips, and/or the spring element may be a leaf spring. The system which can oscillate preferably has a sandwich structure, and/or the piezoelectric element, the spring element and the mass element are designed and arranged like a sandwich. By way of example, the spring element is in this case arranged between the piezoelectric element and the mass element.

For the purposes of a further embodiment of the disclosure, the piezoelectric generator has a housing. The system which can oscillate is preferably arranged within the housing, such that it can oscillate. The system which can oscillate, the stops and/or the eddy-current brake or brakes may be arranged on the housing.

For the purposes of a further embodiment of the disclosure, the piezoelectric generator has an energy store for storage of the electrical energy produced by the piezoelectric element.

A further subject matter of the present disclosure is an electronic apparatus which has a piezoelectric generator according to the disclosure. By way of example, the electronic apparatus may be an apparatus which has no connection to an electrical mains system, and/or may be a portable electronic apparatus. In particular, the piezoelectric generator according to the disclosure may be the only energy source for the electronic apparatus. Furthermore, the electronic apparatus may have one or more sensors, for example a pressure sensor and/or a temperature sensor and/or an acceleration sensor. In particular, the electronic apparatus may be a vehicle tire monitoring system.

A further subject matter of the present disclosure is the use of a piezoelectric generator according to the disclosure in an electronic apparatus, for example an electronic apparatus which has no connection to an electrical mains system, in particular a vehicle tire monitoring system.

BRIEF DESCRIPTION OF THE DRAWINGS

Further advantages and advantageous refinements of the subjects according to the disclosure will be explained in the following description and are illustrated in the drawings. In this case, it should be noted that the drawings have only a descriptive character and are not intended to restrict the disclosure in any way. In the figures.

DETAILED DESCRIPTION

Figure 1A:
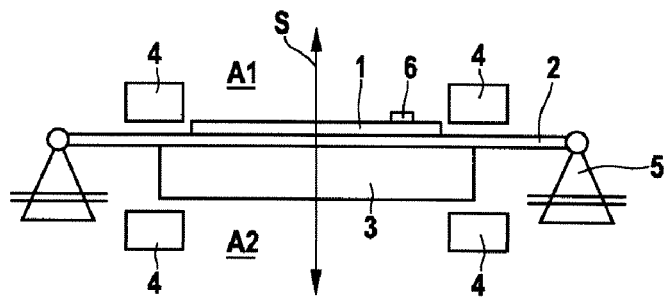
FIG. 1a shows a schematic cross section through a first embodiment of a piezoelectric generator according to the disclosure, along the line A-A.

FIG. 1a shows a first embodiment of a piezoelectric generator according to the disclosure, which has a piezoelectric element 1, a spring element 2, a mass element 3 and four stops 4. FIG. 1a shows that the piezoelectric element 1, the spring element 2 and the mass element 3 form a system which can oscillate. The symbols annotated with the reference sign 5 symbolize that this is mounted such that it can oscillate.

FIG. 1a illustrates that the system which can oscillate has a sandwich structure, wherein the piezoelectric element 1, the spring element 2 and the mass element 3 are designed to be essentially flat, and the spring element 2 is arranged between the piezoelectric element 1 and the mass element 3. In this case, the piezoelectric element 1 is designed and arranged in the form of a strip or strips such that it can be deformed elastically during the oscillation of the system which can oscillate. FIG. 1a furthermore shows that electrical contact is made or can be made with the piezoelectric element 1 via a first electrical contact 6 and via a spring element 2.

FIG. 1a shows that the stops 4 limit the oscillation of the system which can oscillate, on both sides. In this case, the stops 4 on both deflection sides A1, A2 of the oscillation are arranged symmetrically with respect to one another, and at a distance from the system which can oscillate, in the oscillation direction S.

Figure 1B:
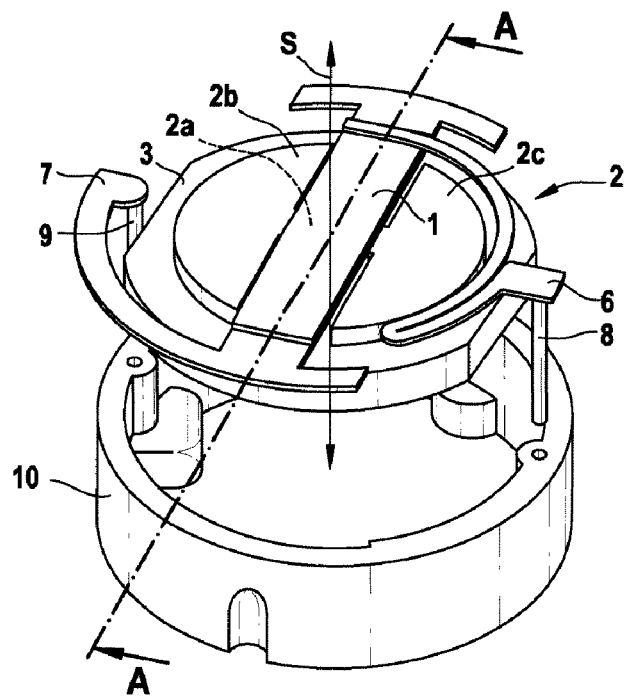
FIG. 1b shows a schematic, perspective view of the first embodiment shown in FIG. 1a (stops not illustrated)

FIG. 1b shows a schematic, perspective view of the first embodiment shown in FIG. 1a. The stops 4 are not illustrated in FIG. 1b. FIG. 1b illustrates that the piezoelectric generator has a housing 10 in which the system which can oscillate is arranged and mounted such that it can oscillate. The spring element 2 is designed essentially in the form of a leaf spring.

For the purposes of the embodiment shown in FIG. 1b, the spring element 2 has an elastic spring area 2a (concealed by the piezoelectric element 1) and two mass element contact areas 2b, 2c. The piezoelectric element rests on the spring area 2a of the spring element 2. FIG. 1b shows that the illustrated piezoelectric generator has two electrical contacts 6, 7 in order to make electrical contact with the piezoelectric element 1. In FIG. 1b, these are arranged on the plane which surrounds the system which can oscillate. The first electrical contact 6 rests on the piezoelectric element 1. The second electrical contact 7 makes contact with the piezoelectric element 1 via the elastic spring area 2a. FIG. 1b furthermore shows that electrical contact can be made or is made with the first electrical contact 6 and the second electrical contact 7 via a respective first contact element 8 and second contact element 9, which are passed through the housing 10.

Figure 2A:
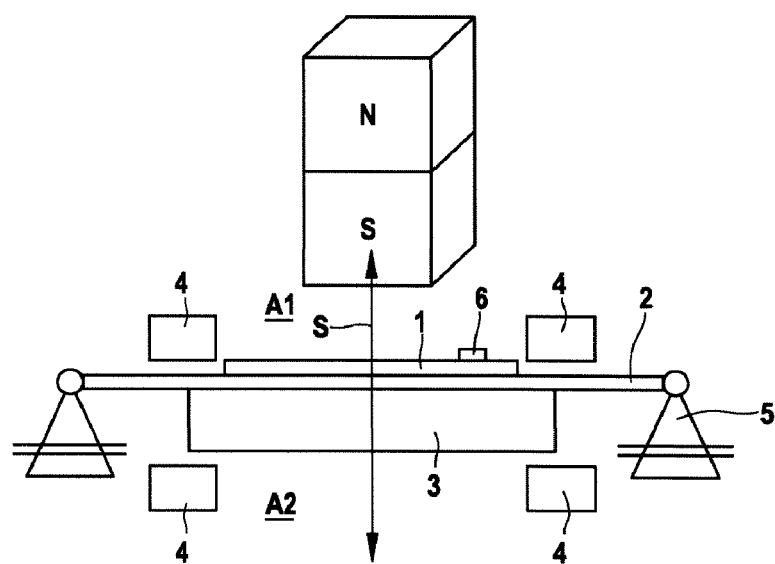
FIG. 2a shows a schematic cross section through a second embodiment of the piezoelectric generator according to the disclosure, along the line A-A.
Figure 2B:
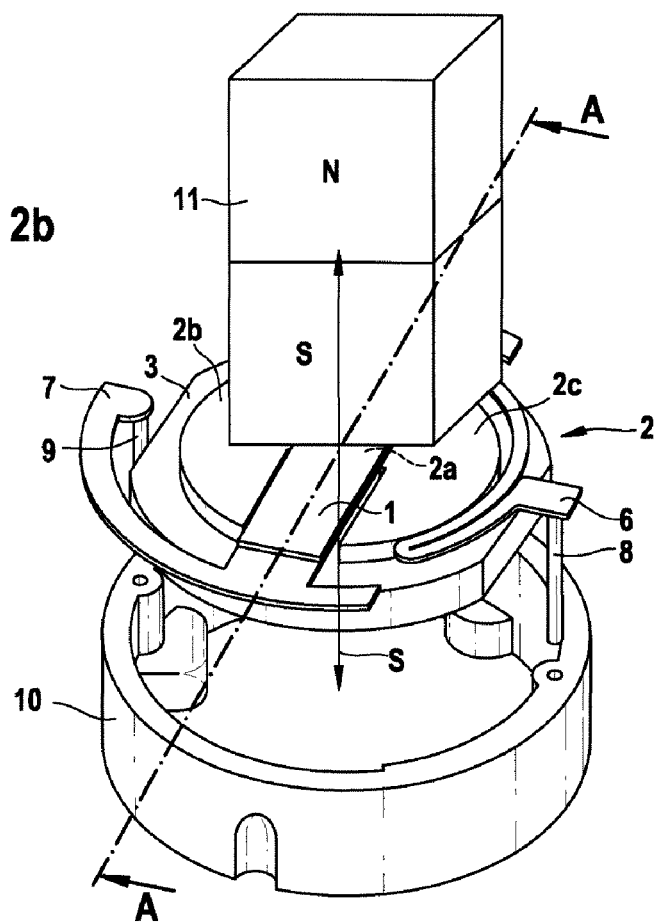
FIG. 2b shows a schematic, perspective view of the second embodiment shown in FIG. 2a (stops not illustrated).

FIGS. 2a and 2b show a second embodiment of the piezoelectric generator according to the disclosure. The second embodiment differs from the first embodiment as shown in FIGS. 1a and 1b in that the piezoelectric generator according to the disclosure also has an eddy-current brake 11. For the purposes of the second embodiment, the eddy-current brake 11 is arranged at a distance from the system which can oscillate, in the oscillation direction S, and the eddy-current brake 11 brakes the oscillation of the system which can oscillate, on one side. The magnetic field of the eddy-current brake 11 in this case passes through the system which can oscillate in the oscillation direction S, to be precise at right angles to the main surface of the system which can oscillate. A maximum braking effect can be achieved by the area with the maximum oscillation of the system which can oscillate being arranged underneath or above the excitation pole of the eddy-current brake. The spring element 2 and the mass element 3 are advantageously designed such that the eddy-currents can be formed over as large an area as possible, and without being interfered with by slots, incisions and the like.

The invention claimed is:

1. A piezoelectric generator comprising:
   a piezoelectric element;
   a spring element;
   a mass element; and
   at least one stop,
   wherein the piezoelectric element, the spring element and the mass element form a system which can oscillate,
   wherein the at least one stop limits the oscillation of the system which can oscillate, at least on one side,
   wherein the at least one stop is formed from a ductile material or has a coating of a ductile material, and
   wherein the ductile material is one of a metal which crystallizes with a face-centered cubic crystal structure, a metal alloy which crystallizes with a face-centered cubic crystal structure, and a plastic to which fibers have been added.

2. The piezoelectric generator as claimed in claim 1, wherein the metal which crystallizes with a face-centered cubic crystal structure or the metal alloy which crystallizes with a face-centered cubic crystal structure is selected from the group consisting of aluminum, copper, iron, gold, silver, lead, nickel, platinum and alloys thereof.

3. The piezoelectric generator as claimed in claim 1, wherein:
   the piezoelectric generator has two or more stops, and
   the stops limit the oscillation of the system which can oscillate, on both sides.

4. The piezoelectric generator as claimed in claim 1, wherein at least one of the spring element and the mass element is formed from a metal or a metal alloy having high electrical conductivity.

5. The piezoelectric generator as claimed in claim 1, wherein:
   the piezoelectric generator has a housing,
   the system which can oscillate is arranged within the housing and on the housing such that it can oscillate, and
   the at least one stop and the at least one eddy-current brake are arranged on the housing.

6. A piezoelectric generator, comprising:
   a piezoelectric element;
   a spring element;
   a mass element;
   at least one eddy-current brake; and
   at least one stop,
   wherein the piezoelectric element, the spring element and the mass element form a system which can oscillate,
   wherein the at least one stop limits the oscillation of the system which can oscillate, at least on one side,
   wherein the at least one stop is formed from a ductile material or has a coating of a ductile material, and
   wherein the at least one eddy-current brake is configured to brake the oscillation of the system which can oscillate, at least on one side.

7. The piezoelectric generator as claimed in claim 6, wherein:
   the at least one eddy-current brake includes two or more eddy-current brakes, and
   the two or more eddy-current brakes are configured to brake the oscillation of the system which can oscillate, on both sides.

8. The piezoelectric generator as claimed in claim 6, wherein:
   the at least one eddy-current brake includes an even number of eddy-current brakes, and
   a first half of the eddy-current brakes are configured to brake the oscillation of the system which can oscillate on a first deflection side, and a second half of the eddy-current brakes are configured to brake the oscillations of the system which can oscillate on a second deflection side.

9. The piezoelectric generator as claimed in claim 8, wherein the even number of eddy-current brakes are arranged on the first and second deflection sides of the oscillation such that their magnetic fields are cancelled out on the plane of the system which can oscillate.

10. The piezoelectric generator as claimed in claim 6, wherein the at least one eddy-current brake is arranged in the immediate vicinity of at least one stop.

11. The piezoelectric generator as claimed in claim 6, wherein the at least one eddy-current brake is a permanent magnet.

12. An electronic apparatus comprising:
    at least one sensor; and
    a piezoelectric generator configured to provide energy to the at least one sensor, the piezoelectric generator including:
       a piezoelectric element,
       a spring element,
       a mass element, and
       at least one stop,
    wherein the piezoelectric element, the spring element, and the mass element form a system which can oscillate,
    wherein the at least one stop limits the oscillation of the system which can oscillate, at least on one side, and
    wherein the at least one stop is formed from a ductile material or has a coating of a ductile material, and
    wherein the ductile material is one of a metal which crystallizes with a face-centered cubic crystal structure, a metal alloy which crystallizes with a face-centered cubic crystal structure, and a plastic to which fibers have been added.

13. The electronic apparatus as claimed in claim 12, wherein the electronic apparatus is a vehicle tire monitoring system.

* * * * *